(12) United States Patent
Wisotzki et al.

(10) Patent No.: US 8,716,067 B2
(45) Date of Patent: May 6, 2014

(54) POWER DEVICE MANUFACTURE ON THE RECESSED SIDE OF A THINNED WAFER

(75) Inventors: Elmar Wisotzki, Darmstadt (DE); Peter Ingram, Hemsbach (DE)

(73) Assignee: IXYS Corporation, Milpitas, CA (US)

( * ) Notice: Subject to any disclaimer, the term of this patent is extended or adjusted under 35 U.S.C. 154(b) by 144 days.

(21) Appl. No.: 13/400,569

(22) Filed: Feb. 20, 2012

(65) Prior Publication Data

US 2013/0217185 A1    Aug. 22, 2013

(51) Int. Cl.
*H01L 21/78*    (2006.01)

(52) U.S. Cl.
USPC .......................................... 438/113; 438/459

(58) Field of Classification Search
None
See application file for complete search history.

(56) References Cited

U.S. PATENT DOCUMENTS

| | | | | |
|---|---|---|---|---|
| 4,266,334 | A * | 5/1981 | Edwards et al. | 438/64 |
| 5,098,861 | A * | 3/1992 | Blackstone | 438/406 |
| 6,162,702 | A | 12/2000 | Morcom et al. | 438/459 |
| 6,284,573 | B1 * | 9/2001 | Farnworth | 438/114 |
| 2008/0090391 | A1 * | 4/2008 | Tsuchitani et al. | 438/510 |
| 2008/0242052 | A1 * | 10/2008 | Feng et al. | 438/459 |
| 2008/0246055 | A1 * | 10/2008 | Schulze et al. | 257/133 |
| 2009/0020854 | A1 | 1/2009 | Feng et al. | 257/619 |
| 2009/0102020 | A1 * | 4/2009 | Sugawara et al. | 257/618 |
| 2009/0181519 | A1 * | 7/2009 | Arai et al. | 438/458 |
| 2010/0009519 | A1 * | 1/2010 | Seddon et al. | 438/464 |
| 2012/0068311 | A1 * | 3/2012 | Yamazaki | 257/619 |

FOREIGN PATENT DOCUMENTS

JP    2000260670    3/1999

* cited by examiner

*Primary Examiner* — Charles Garber
*Assistant Examiner* — Stanetta Isaac
(74) *Attorney, Agent, or Firm* — Imperium Patent Works; T. Lester Wallace; Darien K. Wallace

(57) ABSTRACT

A recess is formed into a first side of a wafer such that a thinned center portion of the wafer is formed, and such that the central portion is surrounded by a thicker peripheral edge support portion. The second side of the wafer remains substantially entirely planar. After formation of the thinned wafer, vertical power devices are formed into the first side of the central portion of the wafer. Formation of the devices involves forming a plurality of diffusion regions into the first side of the thinned central portion. Metal electrodes are formed on the first and second sides, the peripheral portion is cut from the wafer, and the thin central portion is diced to form separate power devices. In one example, a first commercial entity manufactures the thinned wafers, and a second commercial entity obtains the thinned wafers and performs subsequent processing to form the vertical power devices.

23 Claims, 6 Drawing Sheets

DEPOSIT SUSPENSION OF GLASS PARTICLES

FRONT SIDE PROCESSING

BACK SIDE GRINDING

BACK SIDE METALLIZATION

MINIMUM THICKNESS LIMITED BY YIELD DUE TO BREAKAGE

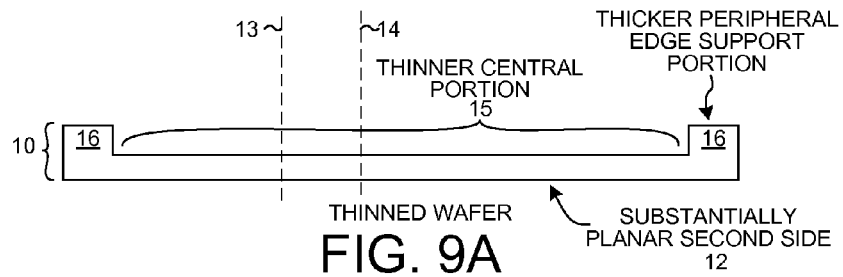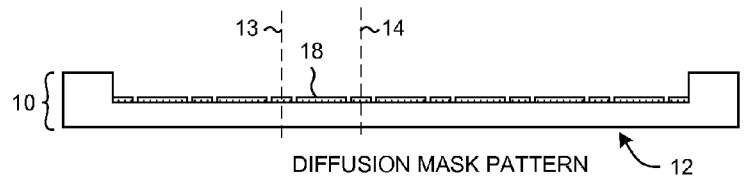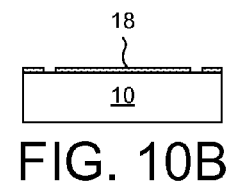
FIG. 9A / FIG. 9B / FIG. 10A / FIG. 10B
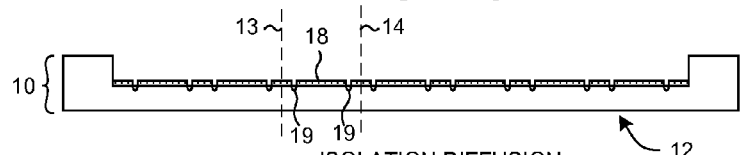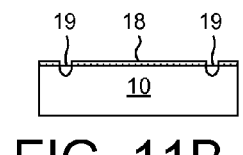
FIG. 11A / FIG. 11B
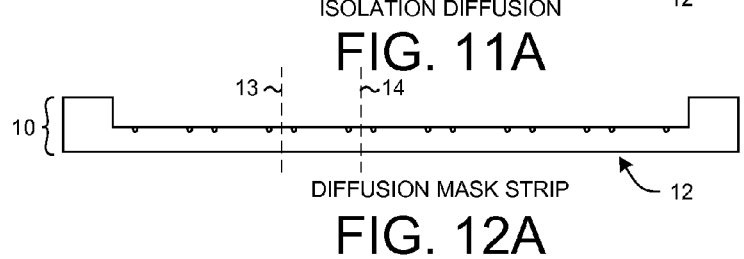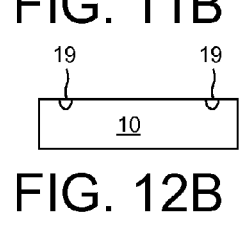
FIG. 12A / FIG. 12B
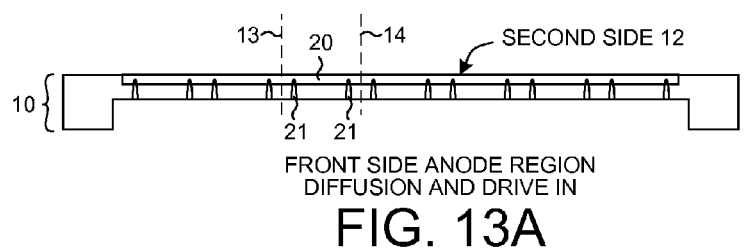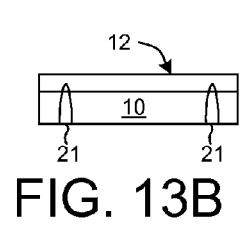
FIG. 13A / FIG. 13B
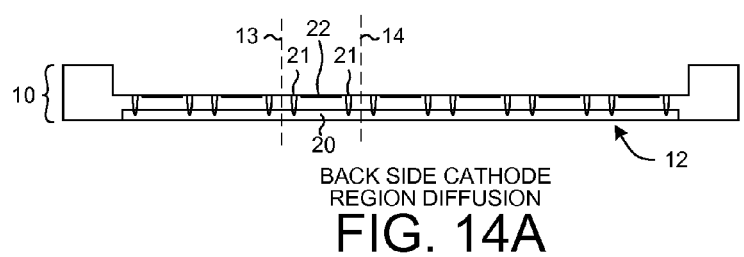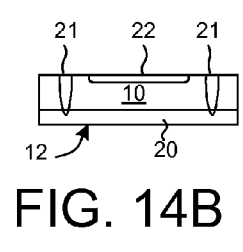
FIG. 14A / FIG. 14B

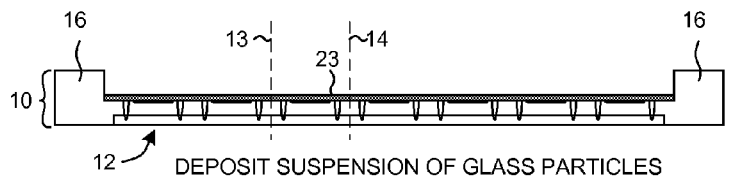 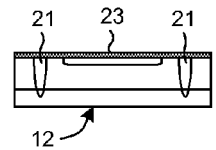
FIG. 15A — DEPOSIT SUSPENSION OF GLASS PARTICLES
FIG. 15B
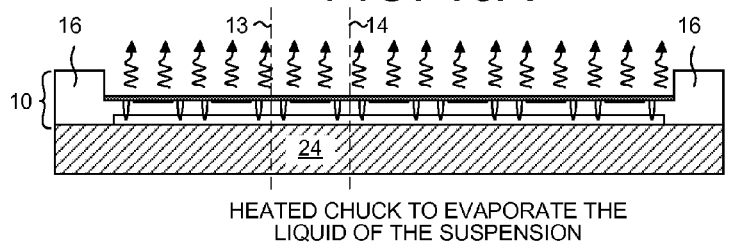 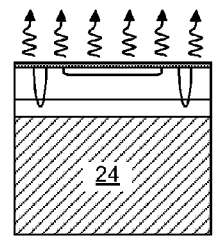
FIG. 16A — HEATED CHUCK TO EVAPORATE THE LIQUID OF THE SUSPENSION
FIG. 16B
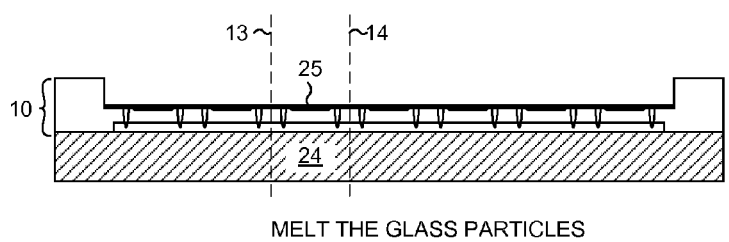 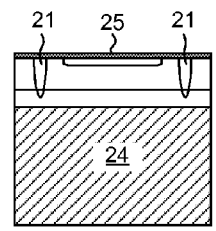
FIG. 17A — MELT THE GLASS PARTICLES
FIG. 17B
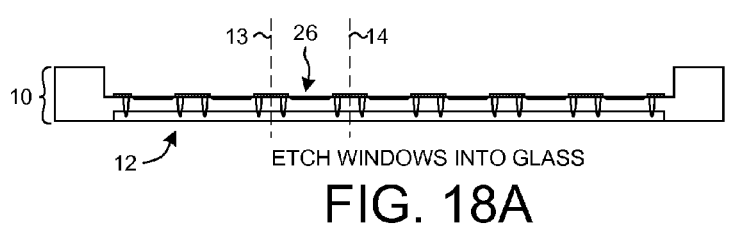 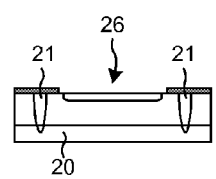
FIG. 18A — ETCH WINDOWS INTO GLASS
FIG. 18B
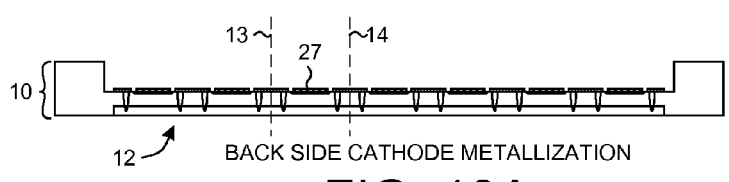 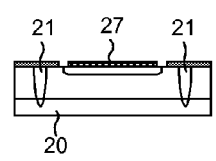
FIG. 19A — BACK SIDE CATHODE METALLIZATION
FIG. 19B

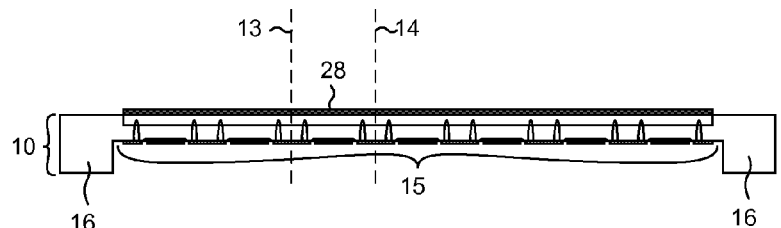 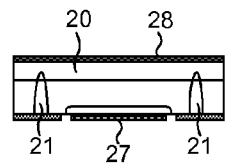
FRONT SIDE ANODE METALLIZATION
FIG. 20A
FIG. 20B
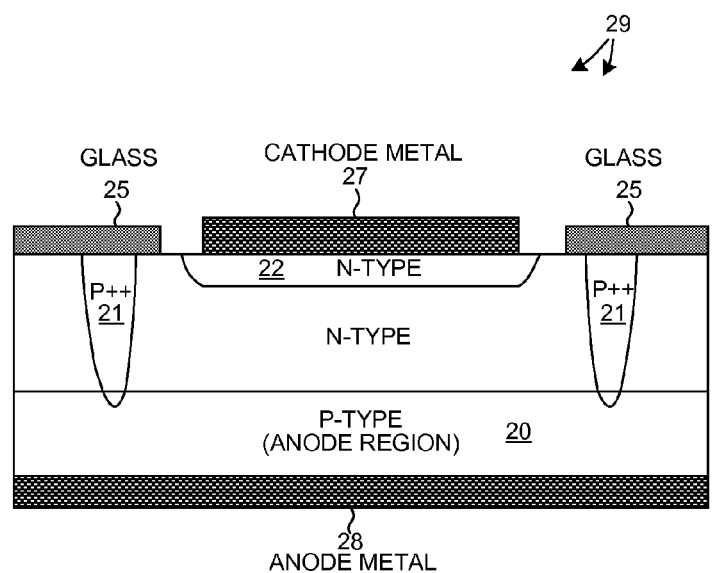
POWER DIODE
FIG. 21 ically, it is normally the goal of the device design engineer to reduce wafer thickness as much as possible as long as the required breakdown voltage of the power device is maintained. Vertical power devices are made in commercial processes on five inch wafers with suitable yields where the thin central portions of the Taiko wafers are as thin as about 200 microns.

POWER DEVICE MANUFACTURE ON THE RECESSED SIDE OF A THINNED WAFER

TECHNICAL FIELD

The described embodiments relate to the manufacture of semiconductor devices on thinned wafers.

BACKGROUND INFORMATION

Vertical power devices, such as power field effect transistors and insulated gate bipolar transistors and power diodes, are sometimes manufactured on thinned wafers. In one exemplary manufacturing process, the front side of an ordinary monocrystalline silicon wafer of uniform thickness undergoes semiconductor fabrication processing such that the device sides of the power devices are formed into the front side of the wafer. One or more metallization layers are generally formed on the front side of the wafer to serve as front side electrodes of the power devices. In the case of a power field effect transistor or an insulated gate bipolar transistor, the control electrode is on the front side of the wafer. In the case of a power diode, the anode is on the front side of the wafer.

After this device formation has occurred, including all diffusion processing steps involved in the formation of the devices, the wafer is flipped over and a central portion of the back side of the wafer is thinned in what is often referred to as the Taiko grinding process. The outer peripheral rim portion of the back side of the wafer is, however, not thinned. As a result, a thicker peripheral edge support portion of the wafer is left surrounding a thinner central portion of the wafer. The thicker peripheral edge support portion provides mechanical stiffening such that the thinner central portion can be handled without cracking of the wafer. The thicker peripheral edge support portion also reduces wafer warpage in later processing steps.

After back side grinding, a back side metallization layer is formed on the thinner central portion of the back side of the wafer. This metallization forms electrodes on the back sides of the power devices. The peripheral edge support portion of the wafer is then cut off, and the thinner central portion of the wafer is diced to form individual power device dice.

In such a vertical power device die, on-state power loss generally occurs in the bulk of the device when current flows vertically from one side of the die, through the bulk of the device, and to the other side of the die. Reducing the resistance through the bulk of the die reduces on-state power loss. Accordingly, it is normally the goal of the device design engineer to reduce wafer thickness as much as possible as long as the required breakdown voltage of the power device is maintained. Vertical power devices are made in commercial processes on five inch wafers with suitable yields where the thin central portions of the Taiko wafers are as thin as about 200 microns.

SUMMARY

A recess is formed into a first side of a monocrystalline silicon wafer such that a thinned center portion of the wafer is formed, and such that the thinned central portion is surrounded by a thicker peripheral edge support portion. In one example, a second side of the wafer opposite the first side remains substantially entirely planar. After formation of the thinned wafer, a plurality of vertical power devices is formed into the first side of the central portion wafer. Formation of the vertical power devices involves forming a plurality of diffusion regions extending into the first side of the thinner central portion. Metal electrodes are formed on the first and second sides of the wafer, the peripheral portion is cut from the wafer, and the thinner central portion is diced to form separate power devices.

In one example, a first commercial entity manufactures a thinned wafer, and a second commercial entity obtains the thinned wafer and performs subsequent semiconductor fabrication processing on the wafer to manufacture the vertical power devices. The thinned wafer has a recess formed into a first side of the wafer such that a thinned central portion of the wafer is surrounded by a thicker peripheral edge support portion, and such that a second side of the wafer is substantially entirely planar. All high temperature diffusion steps involved in the manufacture of the vertical power devices are performed after thinning of the central portions of the thinned wafer. Formation of the device sides of the vertical power devices on the first side of the central portion of the wafer allows the planar second side of the wafer to lie on a supporting planar surface during most of the semiconductor processing steps, thereby reducing the likelihood of wafer breakage and allowing the thickness of the thin central portion to be made thinner while maintaining acceptable yield. The thinner central portion is made to have a thickness not greater than 200 microns, and in one specific example the thickness of the thinner central portion is 175 microns. The reduced thickness of the thin central portion reduces on-state resistance through the vertical power devices and thereby reduces on-state power losses in the power devices.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 9A and 9B are diagrams of the completed Taiko wafer.

FIGS. 10A and 10B are diagrams that illustrate the forming of a photoresist mask used in forming isolation zones from the back side into the thin central portion of the Taiko wafer.

FIGS. 11A and 11B are diagrams that illustrate diffusion occurring through the diffusion mask of FIGS. 10A and 10B.

FIGS. 12A and 12B are diagrams that illustrate the removal of the diffusion mask of FIGS. 10A and 10B.

FIGS. 13A and 13B are diagrams that illustrate the formation of an anode diffusion region into the front side of the wafer.

FIGS. 14A and 14B are diagrams that illustrate the formation of cathode regions into the back side of the thin central portion of the wafer.

FIGS. 15A and 15B are diagrams that illustrate the deposition of a liquid onto the back side of the thin central portion of the wafer, where the liquid includes a suspension of glass particles.

FIGS. 16A and 16B are diagrams that illustrate the evaporation of the liquid of the liquid deposited in FIGS. 15A and 15B.

FIGS. 17A and 17B are diagrams that illustrate the melting of the glass particles of FIGS. 16A and 16B to form a glass layer on the back side of the thin central portion of the wafer.

FIGS. 18A and 18B are diagrams that illustrate the etching of windows into the glass formed in FIGS. 17A and 17B.

FIGS. 19A and 19B are diagrams that illustrate the formation of cathode metal on the back side of the thin central portion of the wafer.

FIGS. 20A and 20B are diagrams that illustrate the formation of anode metal on the front side of the thin central portion of the wafer.

FIG. 21 is a simplified cross-sectional diagram of one of the power device dice formed by dicing the structure of FIGS. 20A and 20B.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "front" and "back" are used herein to describe relative orientations between different parts of the structure being described, and it is to be understood that the overall structure being described can actually be oriented in any way in three-dimensional space.

Figure 1:
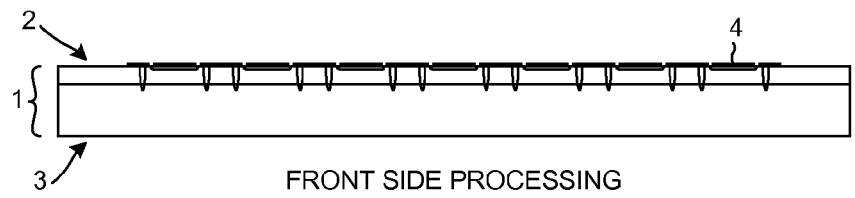
FIGS. 1-4 set forth a problem that has been recognized with a prior art method making of vertical power devices.
Figure 2:
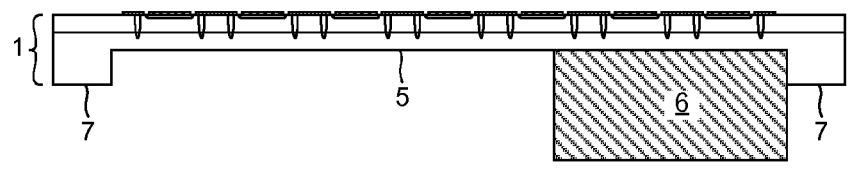
Figure 3:
Figure 4:
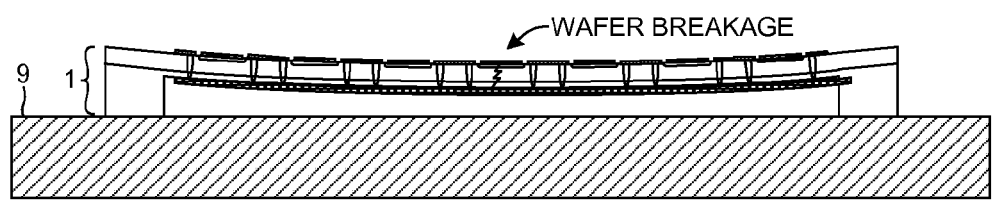

FIGS. 1-4 set forth a problem that has been recognized with a conventional method making of vertical power devices. A wafer 1 has a front side 2 and a back side 3. The wafer 1 undergoes front side processing as illustrated in the cross-sectional view of FIG. 1. The type of power device being manufactured is a power diode. All diffusion steps that will cause diffusion into the front side of the wafer are performed, and then front side metallization layers are formed. This front side metal is patterned to form the cathode electrodes 4 of the diodes. Next, the central portion 5 of the back side 3 of the wafer is thinned as illustrated in FIG. 2. Block 6 represents the grinding wheel used. The peripheral portion 7 of the wafer is not thinned but rather is left at its original thickness to serve a stiffening function. Next, back side metallization is performed. This back side metal is patterned to form the anode electrodes 8 of the diodes. The resulting wafer structure is shown in cross-section in FIG. 3. In later processing steps, the thinned wafer is often made to rest front side up on a surface 9 as illustrated in FIG. 4. If the wafer is thinned to be smaller than about 200 microns, then wafer breakage is seen to occur to such a degree that production yield decreases to unacceptably low levels. The minimum thickness of the thinned central portion of the wafer is limited to be about 200 microns.

Figures 5A, 5B:
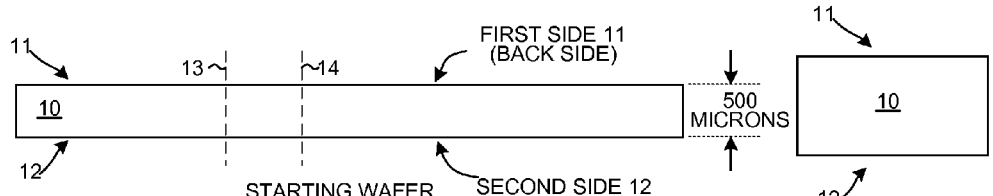
FIGS. 5A and 5B are diagrams of a starting wafer used in a method in accordance with one novel aspect.
Figure 6A:
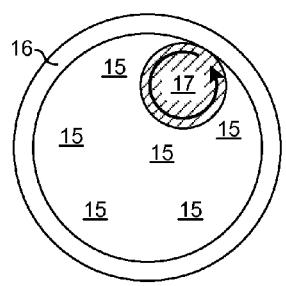
FIG. 6A is a top-down diagram that shows how a recess is formed into a first side of the starting wafer of FIGS. 5A and 5B, thereby forming a so-called Taiko wafer.
Figure 6B:
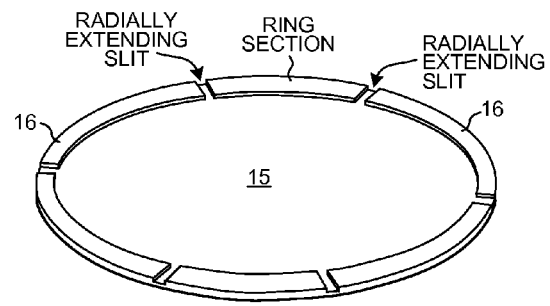
FIG. 6B is a perspective view of a recess formed in the first side of a wafer and radially extending slits formed in a peripheral edge support that surrounds the recess.

FIGS. 5A-21 are a sequence of diagrams that sets forth a method of manufacturing vertical power devices in accordance with one novel aspect. FIG. 5A is a cross-sectional diagram of a starting wafer 10 having a front side 12 and a back side 11. FIG. 5B is an enlarged view of the section of the wafer of FIG. 5A between lines 13 and 14. In the present example, wafer 10 is a wafer of monocrystalline silicon having a slight N-type phosphorous doping concentration. Wafer 10 is 500 microns thick, and has a diameter of 5 inches.

Next, back side wafer thinning is performed. In the present example, Taiko grinding is employed to form a circular recess into the central portion of the back side 11 of wafer 10. A grinding wheel 17 is used. As a result of the formation of this recess, a thinner central portion 15 of the wafer is formed. A thicker peripheral edge support portion 16 of the original thickness of the starting wafer is left to surround the thinner central portion 15 of the wafer. In the present example, peripheral edge support portion 16 has a cylindrical inside wall 16A. The back side surface of the thinner central portion 15 is planar, has a circular periphery, and is more than three inches in diameter.

Figure 7:
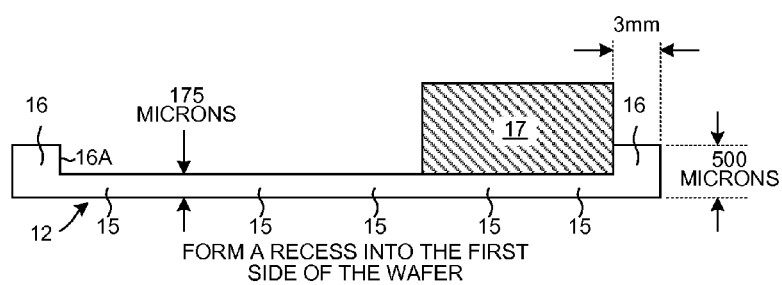
FIG. 7 is a side-view diagram of the grinding process illustrated in FIG. 6.

FIG. 7 is a cross-sectional diagram of the thinned wafer. Thinner central portion 15 has a thickness less than 200 microns. In the present example, the thickness of thinner central portion 15 is 175 microns. Thicker peripheral edge support portion 16 has a thickness of 500 microns. The width of thicker peripheral edge support portion 16 is about 3 millimeters. Thicker peripheral edge support portion 16 in some cases has radial slits and is not a single contiguous ring structure, but rather is a ring structure made up of numerous ring sections with open radially extending slits between the ring sections. In the present example, the front side 12 of wafer 10 is unprocessed and remains entirely planar. In other examples, the front side of the wafer is not entirely planar, but rather the front side also has one or more recesses extending into the front side of the wafer.

Figures 8A, 8B:
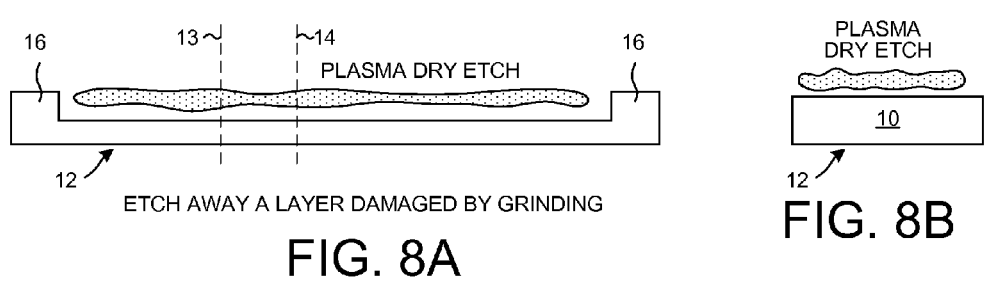
FIGS. 8A and 8B are diagrams of an etching step used in manufacturing the Taiko wafer of FIG. 6.

Next, an etching step is performed to remove grinding debris and to remove silicon on the surface of the thinner central portion 15 that was damaged during the Taiko grinding process. Dry etching involving a plasma is employed to make the thinner central portion 15 another 15 microns thinner. The result of this dry etching step is illustrated in FIG. 8A. FIG. 8B is an enlarged view of a section of the wafer of FIG. 5A between lines 13 and 14. Dry etching need not be used, but rather another suitable processing technique may be employed to remove damage from the Taiko grinding processor.

FIGS. 9A and 9B show the finished thinned wafer. This thinned wafer is sometimes referred to as a Taiko wafer. In one example, the processing steps illustrated in FIGS. 5A-9B are performed by a first commercial entity that makes the thinned wafer, and the thinned wafer of FIGS. 9A and 9B is then sold and supplied to a second commercial entity that then carries out the remaining steps illustrated in FIGS. 10A-21. The first entity may be a manufacturer of Taiko wafers such as illustrated in FIGS. 9A and 9B. The second entity may be a semiconductor fabrication company that obtains wafers from the first entity, and that then performs semiconductor processing on the wafers to make finished semiconductor devices.

As shown in FIGS. 10A and 10B, by standard semiconductor fabrication technology a layer of a diffusion mask is then formed over the thinner central portion 15 of the back side of the wafer, to form pattern 18. A ring of silicon around the periphery of what will become each power device is left exposed by the mask.

Next, a P-type dopant (for example aluminum) is diffused through the openings in mask 18 to later form isolation zones as illustrated in FIGS. 11A and 11B. Reference numeral 19 identifies one such ring-shaped isolation zone. The isolation zone extends in a ring around what will become a power device.

Mask 18 is then removed, leaving the structure illustrated in FIGS. 12A and 12B.

Next, the wafer structure is flipped over and a P-type dopant (for example, boron) is diffused from the front side 12 of the wafer to form an anode diffusion region 20. Simultaneously with the diffusion of the P-type anode dopant into the wafer from the front side, the P-type dopants of the isolation zones diffuse deeper into the wafer from the back side. As illustrated in FIGS. 13A and 13B, the resulting isolation regions extend from the back side of the wafer and overlap with the P-type anode diffusion region that extends from the front side. Reference numeral 21 identifies one such ring-shaped isolation region. The P-type anode region 20 need not extend laterally all the way out to the peripheral edge of the wafer. Photomasking steps are therefore involved in forming the anode region. These photomasking steps are not illustrated here.

Next, additional photomasking and diffusion steps are performed to form N-type cathode diffusion regions. These N-type cathode diffusion regions extend into the back side of the wafer. Reference number 22 identifies one such cathode diffusion region. All diffusion steps involve high temperatures in excess of 1000 degrees Celsius. The resulting wafer structure 10 involving the cathode diffusion regions is shown in FIGS. 14A and 14B.

Because the main blocking PN junction extends to the upper semiconductor surface, this PN junction needs protection from high humidity and contamination conditions. A glass passivation layer is therefore provided over the PN junction at the semiconductor surface. A layer 23 of a liquid having glass particles suspended in it is deposited onto the thinner central portion 15 of the back side of the wafer as illustrated in FIGS. 15A and 15B. Peripheral portion 16 forms a dam for the liquid material. A heated chuck 24 or other surface is then used to heat layer 23 homogeneously such that the liquid evaporates evenly, leaving an even thickness of glass particles distributed across the surface of thin central portion 15 as illustrated in FIGS. 16A and 16B. Even uniform heating of the wafer in this evaporation step is facilitated due to good contact between the planar front side 12 of the wafer and the corresponding planar top side of heated chuck 24.

In another high temperature step illustrated in FIGS. 17A and 17B, the glass particles are melted at about 700 degrees Celsius, thereby forming a thick and dense glassivation layer 25 over the thin central portion of the wafer. The glassivation layer 25 is more than ten microns thick and in one specific example is 20 microns thick.

Next, windows are etched into glass layer 25 as illustrated in FIGS. 18A and 18B. In the area of each power device, one such window exposes the area that will be covered with a cathode electrode. The photomasking steps involved in forming these windows are not represented in the drawings. Reference numeral 26 of FIGS. 18A and 18B identifies the window over the power device being formed between lines 13 and 14.

Next, as illustrated in FIGS. 19A and 19B, back side metallization is deposited by physical vapor deposition or sputtering, and is patterned to form a cathode metal electrode for each power device being formed. Reference numeral 27 identifies the cathode metal electrode for the power device being formed between lines 13 and 14.

Wafer structure 10 is then flipped over, and front side anode metallization 28 is deposited as illustrated in FIGS. 20A and 20B. Photomasking steps associated with forming the anode metallization 28 are not illustrated.

The thicker peripheral edge support portion 16 is then cut off, and the remaining thinner central portion 15 is diced to form individual power device dice. Dicing can be performed by any suitable method, including saw cutting and pulsed laser cutting.

FIG. 21 is an enlarged diagram of one of the resulting power device dice. The power device 29 is a power diode having a blocking voltage of 1700 volts.

The method of FIGS. 5-21 is advantageous in that it reduces the number of processing steps in which the thinned wafer being processed is not laying front side 12 down on a supporting surface. In the steps illustrated in FIGS. 5-21, only the anode diffusion of FIGS. 13A and 13B and the anode metallization of FIGS. 20A and 20B occur with the front side 12 of the wafer 10 not laying face down on a supporting surface.

Figure 22:
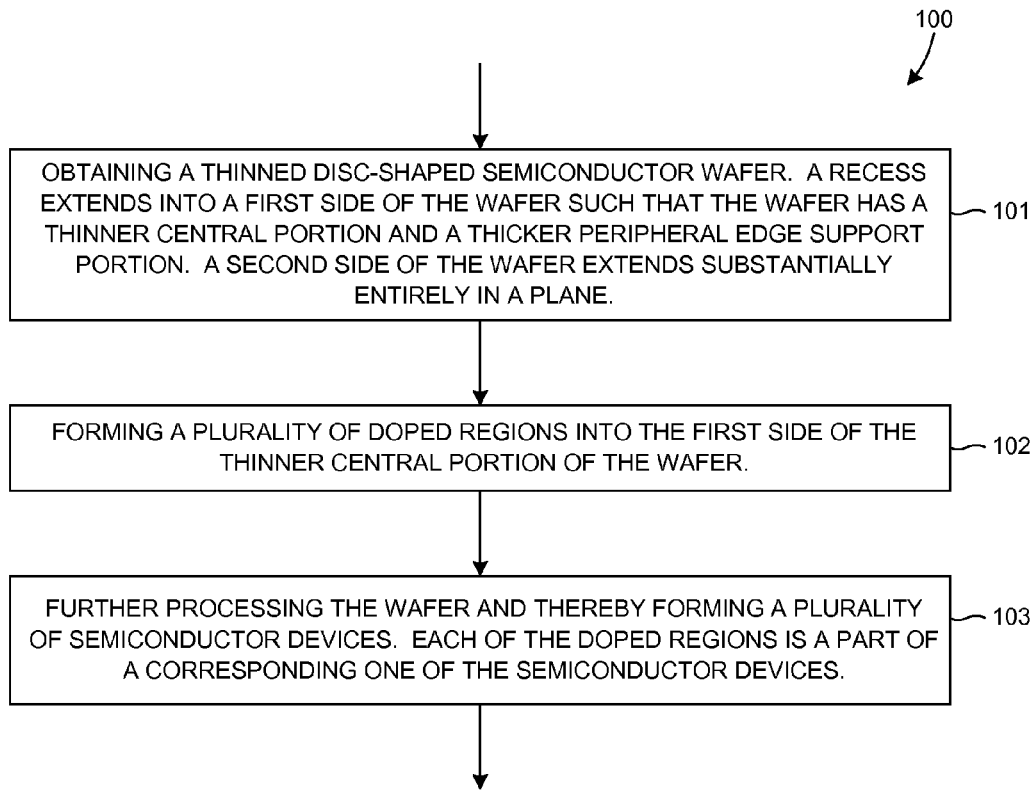
FIG. 22 is a flowchart of a method 100 in accordance with one novel aspect.

FIG. 22 is a flowchart of a method 100 in accordance with one novel aspect. A thinned wafer is obtained (step 101), where the thinned wafer has a recess formed into a first side (the back side) of the wafer such that the wafer has a thinner central portion and a thicker peripheral edge support portion. A second side (the front side) of the wafer opposite the first side extends substantially entirely in a plane. In one example, the wafer of step 101 is wafer 10 illustrated in FIG. 9A. At the conclusion of step 101, no diffusion region extends from the first side (the back side) into the thinner central portion of the wafer. Next, after the formation of the recess that forms the thinner central portion, a plurality of doped regions is formed (step 102) from the first side (the back side) into the thinner central portion of the wafer. In one example, these doped regions are the doped regions 20, 21 and 22 of FIG. 14A. Further processing is then performed on the wafer (step 103) thereby forming a plurality of semiconductor devices. Each of the doped regions formed in step 102 is a part of a corresponding one of the semiconductor devices. In one example, the semiconductor devices are vertical power devices.

Figure 23:
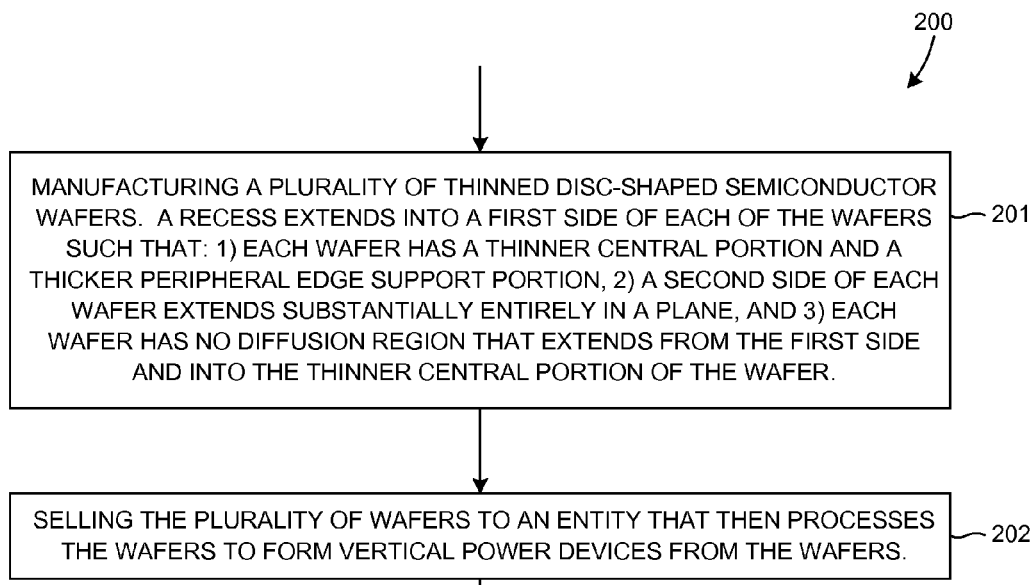
FIG. 23 is a flowchart of a method 200 in accordance with one novel aspect.

FIG. 23 is a flowchart of a method 200 in accordance with one novel aspect. A plurality of thinned disc-shaped semiconductors wafers are formed (step 201). A recess is formed into a first side (the back side) of each of the wafers such that: 1) each wafer has a thinner central portion and a thicker peripheral edge support portion, 2) a second side (the front side) of each of the wafers extends substantially entirely in a plane, and 3) each wafer has no diffusion region that extends from the back side into the thinner central portion of the wafer. The manufacturing of step 201 is performed by a first commercial entity (for example, a Taiko wafer manufacturing company). After the manufacturing of step 201 by the first commercial entity, the wafers are sold (step 202) to a second commercial entity (for example, a semiconductor fabrication house) that then processes the wafers to form vertical power devices from the wafers.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:
1. A method comprising:
   (a) obtaining a thinned disc-shaped semiconductor wafer, wherein a recess extends into a first side of the wafer such that the wafer has a thinner central portion and a thicker peripheral edge support portion;

(b) forming a P-type isolation zone in the thinner central portion of the first side of the wafer;

(c) forming a P-type diffusion region in a second side of the wafer opposite the first side such that the P-type isolation zone overlaps the P-type diffusion region, wherein the thicker peripheral edge support portion is a part of the wafer at the time of the forming of (b) and the forming of (c);

(d) forming a glassivation layer over the P-type isolation zone; and (e) further processing the wafer after (b), (c) and (d) and thereby forming a plurality of semiconductor devices, wherein the P-type isolation zone formed in (b), the P-type diffusion region formed in (c), and the glassivation layer formed in (d) are parts of one of the semiconductor devices.

2. The method of claim 1, wherein the one of the semiconductor devices is a vertical power device taken from the group consisting of: a power diode, and a power bipolar transistor.

3. The method of claim 1, wherein the first side of the thinner central portion has a planar surface, wherein the planar surface has a disc-shape with a substantially circular circumference, and wherein the planar surface is more than three inches wide.

4. The method of claim 1, wherein the second side of the wafer opposite the first side extends substantially entirely in a plane.

5. The method of claim 1, wherein the obtaining of the wafer in (a) is accomplished by an action taken from the group consisting of: a) purchasing the thinned wafer, and b) manufacturing the thinned wafer.

6. The method of claim 1, wherein the glassivation layer is formed over the first side of the thinner central portion of the wafer, wherein the thicker peripheral edge support portion is a part of the wafer at the time of the forming of the glassivation layer, and wherein the glassivation layer is at least ten microns thick.

7. The method of claim 1, wherein (e) involves removing the thicker peripheral edge support portion and dicing the thinner central portion.

8. The method of claim 1, wherein the thicker peripheral edge support portion has a plurality of radially extending slits.

9. A method comprising:

(a) obtaining a thinned disc-shaped semiconductor wafer, wherein a recess extends into a first side of the wafer such that the wafer has a thinner central portion and a thicker peripheral edge support portion, wherein a second side of the wafer opposite the first side extends substantially entirely in a plane;

(b) forming a first doped region into the first side of the thinner central portion of the wafer;

(c) forming a second doped region in the second side of the wafer such that the first doped region overlaps the second doped region;

(d) forming a glassivation layer over the first doped region, wherein the thicker peripheral edge support portion is a part of the wafer at the time of the forming of (b), the forming of (c) and the forming of (d); and (e) dicing the wafer to form a plurality of semiconductor devices, wherein the first doped region formed in (b), the second doped region formed in (c), and the glassivation layer formed in (d) are parts of one of the semiconductor devices.

10. The method of claim 9, wherein one of the semiconductor devices is a vertical power device, and wherein the vertical power device is taken from the group consisting of: a power diode, a power field effect transistor, a power insulated gate bipolar transistor.

11. The method of claim 9, wherein the first doped region is a P-type isolation zone.

12. The method of claim 11, wherein the second doped region is a P-type diffusion region.

13. The method of claim 9, wherein the thinner central portion of the wafer is not greater than two hundred microns thick.

14. The method of claim 9, wherein the thinner central portion of the wafer has a planar surface, wherein the planar surface has a disc-shape with a substantially circular circumference, and wherein the planar surface is more than three inches wide.

15. The method of claim 9, wherein the thicker peripheral edge support portion has a cylindrical sidewall.

16. The method of claim 9, wherein the first doped region formed in (b) is an isolation structure.

17. The method of claim 9, further comprising before (e):
(f) forming a cathode diffusion region into the thinner central portion.

18. The method of claim 17, further comprising before (e):
(g) forming a cathode metal electrode over the cathode diffusion region.

19. The method of claim 18, further comprising before (e):
(h) forming an anode metal electrode on the second side of the wafer.

20. The method of claim 9, wherein a cathode of a diode is formed into the first side of the thinner central portion of the wafer.

21. The method of claim 9, wherein a gate of a transistor is formed into the first side of the thinner central portion of the wafer.

22. The method of claim 9, wherein an emitter of a transistor is formed into the first side of the thinner central portion of the wafer.

23. The method of claim 9,
wherein the glassivation layer is more than ten microns thick.

* * * * *